(12) United States Patent
Derderian (10) Patent No.: US 8,101,459 B2
(45) Date of Patent: Jan. 24, 2012

(54) METHODS FOR ASSEMBLING SEMICONDUCTOR DEVICES IN STACKED ARRANGEMENTS BY POSITIONING SPACERS THEREBETWEEN

(75) Inventor: James M. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/834,651

(22) Filed: Apr. 29, 2004

(65) Prior Publication Data

US 2004/0200885 A1 Oct. 14, 2004

Related U.S. Application Data

(62) Division of application No. 09/939,258, filed on Aug. 24, 2001, now abandoned.

(51) Int. Cl.
*H01L 21/00* (2006.01)
(52) U.S. Cl. .................. 438/109; 438/117; 438/118
(58) Field of Classification Search .................. None
See application file for complete search history.

(56) References Cited

U.S. PATENT DOCUMENTS

| | | | |
|---|---|---|---|
| 3,811,186 A | 5/1974 | Lamerd et al. | |
| 3,871,015 A | 3/1975 | Lin et al. | |
| 4,764,804 A * | 8/1988 | Sahara et al. | 257/717 |
| 4,866,507 A | 9/1989 | Jacobs et al. | |
| 4,897,708 A * | 1/1990 | Clements | 257/690 |
| 4,989,069 A * | 1/1991 | Hawkins | 257/693 |
| 5,012,323 A | 4/1991 | Farnworth | |
| 5,056,215 A | 10/1991 | Blanton | |
| 5,154,341 A * | 10/1992 | Melton et al. | 228/180.22 |
| 5,220,200 A | 6/1993 | Blanton | |
| 5,269,453 A * | 12/1993 | Melton et al. | 228/180.22 |
| 5,323,060 A | 6/1994 | Fogal et al. | |
| 5,323,084 A * | 6/1994 | Haitz | 313/500 |

(Continued)

FOREIGN PATENT DOCUMENTS

EP 0463297 A1 3/1991

(Continued)

OTHER PUBLICATIONS

U.S. Appl. No. 09/590,527, filed Jun. 8, 2000, entitled "Structures for Stabilizing Semiconductor Devices Relative to Test Substrates and Methods for Fabricating the Stabilizers", inventor Salman Akram.

(Continued)

*Primary Examiner* — David Graybill
(74) *Attorney, Agent, or Firm* — TraskBritt (57) ABSTRACT

A method for assembling semiconductor devices includes providing a first semiconductor device, securing spacers to noncircuit bond pads of the first semiconductor device, and positioning a second semiconductor device on the spacers. Adhesive material may be applied to a surface of one or both of the first and second semiconductor devices prior to positioning of the second semiconductor device, or introduced between first and second semiconductor devices. The noncircuit bond pads may be electrically isolated from other structures of the first semiconductor device or communicate with a ground or reference voltage plane, in which case the back side of the second semiconductor device may communicate with the ground or reference voltage plane upon being positioned against the spacers. Additional semiconductor devices may be added to the assembly. The first semiconductor device may be associated with a substrate. Assemblies and packages at least partially fabricated by the method are also disclosed.

27 Claims, 3 Drawing Sheets

U.S. PATENT DOCUMENTS

| | | | |
|---|---|---|---|
| 5,399,898 A * | 3/1995 | Rostoker | 257/499 |
| 5,400,950 A * | 3/1995 | Myers et al. | 228/180.22 |
| 5,476,211 A * | 12/1995 | Khandros | 228/180.5 |
| 5,484,314 A | 1/1996 | Farnworth | |
| 5,518,964 A * | 5/1996 | DiStefano et al. | 438/113 |
| 5,614,766 A * | 3/1997 | Takasu et al. | 257/777 |
| 5,633,535 A | 5/1997 | Chao et al. | |
| 5,654,226 A | 8/1997 | Temple et al. | |
| 5,659,952 A * | 8/1997 | Kovac et al. | 29/840 |
| 5,700,715 A | 12/1997 | Pasch | |
| 5,726,492 A * | 3/1998 | Suzuki et al. | 257/685 |
| 5,763,939 A * | 6/1998 | Yamashita | 257/668 |
| 5,763,941 A * | 6/1998 | Fjelstad | 257/669 |
| 5,772,451 A * | 6/1998 | Dozier et al. | 439/70 |
| 5,793,108 A * | 8/1998 | Nakanishi et al. | 257/723 |
| 5,804,004 A | 9/1998 | Tuckerman et al. | |
| 5,804,874 A | 9/1998 | An et al. | |
| 5,813,115 A * | 9/1998 | Misawa et al. | 29/832 |
| 5,820,014 A * | 10/1998 | Dozier et al. | 228/56.3 |
| 5,832,601 A * | 11/1998 | Eldridge et al. | 29/843 |
| 5,841,197 A | 11/1998 | Adamic, Jr. | |
| 5,841,198 A | 11/1998 | Chia et al. | |
| 5,852,871 A * | 12/1998 | Khandros | 29/843 |
| 5,864,177 A | 1/1999 | Sundstrom | |
| 5,864,946 A * | 2/1999 | Eldridge et al. | 29/843 |
| 5,884,398 A * | 3/1999 | Eldridge et al. | 29/843 |
| 5,953,814 A * | 9/1999 | Sozansky et al. | 29/840 |
| 5,976,913 A * | 11/1999 | Distefano | 438/113 |
| 5,985,682 A | 11/1999 | Higgins, III | |
| 5,998,228 A * | 12/1999 | Eldridge et al. | 438/15 |
| 6,005,778 A * | 12/1999 | Spielberger et al. | 361/770 |
| RE36,613 E | 3/2000 | Ball | |
| 6,032,356 A * | 3/2000 | Eldridge et al. | 29/843 |
| 6,046,910 A | 4/2000 | Ghaem et al. | |
| 6,049,976 A * | 4/2000 | Khandros | 29/843 |
| 6,051,886 A | 4/2000 | Fogal et al. | |
| 6,054,337 A * | 4/2000 | Solberg | 438/107 |
| 6,063,648 A * | 5/2000 | Beroz et al. | 438/113 |
| 6,084,284 A | 7/2000 | Adamic, Jr. | |
| 6,087,718 A | 7/2000 | Cho | |
| 6,100,594 A | 8/2000 | Fukui et al. | |
| 6,107,682 A * | 8/2000 | Fjelstad | 257/693 |
| 6,124,179 A | 9/2000 | Adamic, Jr. | |
| 6,133,072 A * | 10/2000 | Fjelstad | 438/128 |
| 6,133,637 A * | 10/2000 | Hikita et al. | 257/777 |
| 6,147,401 A * | 11/2000 | Solberg | 257/723 |
| 6,160,526 A * | 12/2000 | Hirai et al. | 343/895 |
| 6,162,665 A | 12/2000 | Zommer | |
| 6,166,476 A * | 12/2000 | Nakashima et al. | 310/313 R |
| 6,168,974 B1 * | 1/2001 | Chang et al. | 438/109 |
| 6,175,157 B1 * | 1/2001 | Morifuji | 257/777 |
| 6,183,267 B1 * | 2/2001 | Marcus et al. | 439/66 |
| 6,191,487 B1 | 2/2001 | Rodenbeck et al. | |
| 6,208,024 B1 * | 3/2001 | DiStefano | 257/696 |
| 6,212,767 B1 | 4/2001 | Tandy | |
| 6,215,670 B1 * | 4/2001 | Khandros | 361/774 |
| 6,231,974 B1 * | 5/2001 | Yamakawa et al. | 428/354 |
| 6,232,668 B1 * | 5/2001 | Hikita et al. | 257/777 |
| 6,242,803 B1 * | 6/2001 | Khandros et al. | 257/750 |
| 6,246,247 B1 * | 6/2001 | Eldridge et al. | 324/761 |
| 6,252,175 B1 * | 6/2001 | Khandros | 174/250 |
| 6,265,771 B1 | 7/2001 | Ference et al. | |
| 6,271,598 B1 | 8/2001 | Vindasius et al. | |
| 6,274,823 B1 * | 8/2001 | Khandros et al. | 174/261 |
| 6,279,227 B1 * | 8/2001 | Khandros et al. | 29/885 |
| 6,281,577 B1 | 8/2001 | Oppermann et al. | |
| 6,287,895 B1 | 9/2001 | Sato | |
| 6,294,040 B1 * | 9/2001 | Raab et al. | 156/249 |
| 6,297,063 B1 * | 10/2001 | Brown et al. | 438/2 |
| 6,297,547 B1 * | 10/2001 | Akram | 257/676 |
| 6,313,528 B1 * | 11/2001 | Solberg | 257/723 |
| 6,316,727 B1 | 11/2001 | Liu | |
| 6,333,562 B1 * | 12/2001 | Lin | 257/777 |
| 6,336,269 B1 * | 1/2002 | Eldridge et al. | 29/885 |
| 6,340,822 B1 * | 1/2002 | Brown et al. | 257/25 |
| 6,340,846 B1 * | 1/2002 | LoBianco et al. | 257/783 |
| 6,362,520 B2 * | 3/2002 | DiStefano | 257/696 |
| 6,388,313 B1 | 5/2002 | Lee et al. | |
| 6,392,292 B1 * | 5/2002 | Morishita | 257/686 |
| 6,400,007 B1 * | 6/2002 | Wu et al. | 257/686 |
| 6,406,938 B2 | 6/2002 | Rodenbeck et al. | |
| 6,410,366 B1 | 6/2002 | Hashimoto | |
| 6,429,509 B1 * | 8/2002 | Hsuan | 257/690 |
| 6,437,449 B1 | 8/2002 | Foster | |
| 6,441,496 B1 * | 8/2002 | Chen et al. | 257/777 |
| 6,448,659 B1 | 9/2002 | Lee | |
| 6,452,259 B2 * | 9/2002 | Akiyama | 257/686 |
| 6,461,881 B1 | 10/2002 | Farnworth et al. | |
| 6,462,420 B2 * | 10/2002 | Hikita et al. | 257/777 |
| 6,472,758 B1 * | 10/2002 | Glenn et al. | 257/777 |
| 6,476,333 B1 * | 11/2002 | Khandros et al. | 174/267 |
| 6,476,503 B1 * | 11/2002 | Imamura et al. | 257/780 |
| 6,483,190 B1 * | 11/2002 | Kainuma et al. | 257/737 |
| 6,483,328 B1 * | 11/2002 | Eldridge et al. | 324/754 |
| 6,484,395 B1 * | 11/2002 | Marcus et al. | 29/842 |
| 6,486,547 B2 * | 11/2002 | Smith et al. | 257/688 |
| 6,495,462 B1 * | 12/2002 | Haba et al. | 438/689 |
| 6,504,223 B1 * | 1/2003 | Zhou et al. | 257/503 |
| 6,518,664 B2 * | 2/2003 | Miyamoto | 257/737 |
| 6,528,889 B1 * | 3/2003 | Matsuhira et al. | 257/778 |
| 6,531,784 B1 * | 3/2003 | Shim et al. | 257/777 |
| 6,545,365 B2 | 4/2003 | Kondo et al. | |
| 6,564,449 B1 | 5/2003 | Tsai et al. | |
| 6,593,662 B1 | 7/2003 | Pu et al. | |
| 6,602,733 B2 * | 8/2003 | Iwahashi et al. | 438/108 |
| 6,603,072 B1 | 8/2003 | Foster et al. | |
| 6,607,937 B1 | 8/2003 | Corisis | |
| 6,621,172 B2 * | 9/2003 | Nakayama et al. | 257/787 |
| 6,624,005 B1 | 9/2003 | DiCaprio et al. | |
| 6,630,365 B2 | 10/2003 | Farnworth et al. | |
| 6,649,444 B2 | 11/2003 | Farnworth et al. | |
| 6,682,954 B1 | 1/2004 | Ma et al. | |
| 6,724,084 B1 * | 4/2004 | Hikita et al. | 257/737 |
| 6,727,579 B1 * | 4/2004 | Eldridge et al. | 257/692 |
| 6,778,406 B2 * | 8/2004 | Eldridge et al. | 361/776 |
| 6,809,421 B1 * | 10/2004 | Hayasaka et al. | 257/777 |
| 6,835,898 B2 * | 12/2004 | Eldridge et al. | 174/267 |
| 6,956,174 B2 * | 10/2005 | Khandros et al. | 174/267 |
| 7,064,566 B2 * | 6/2006 | Khandros et al. | 324/754 |
| 7,084,656 B1 * | 8/2006 | Khandros et al. | 324/762 |
| 2001/0000927 A1 | 5/2001 | Rodenbeck et al. | |
| 2001/0035587 A1 | 11/2001 | Kondo et al. | |
| 2001/0042906 A1 * | 11/2001 | Nakamura et al. | 257/668 |
| 2001/0048151 A1 | 12/2001 | Chun | |
| 2001/0048591 A1 * | 12/2001 | Fjelstad et al. | 361/767 |
| 2002/0008309 A1 * | 1/2002 | Akiyama | 257/686 |
| 2002/0043711 A1 | 4/2002 | Akram et al. | |
| 2002/0045290 A1 * | 4/2002 | Ball | 438/106 |
| 2002/0068417 A1 | 6/2002 | Farnworth et al. | |
| 2002/0074637 A1 * | 6/2002 | McFarland | 257/686 |
| 2002/0185746 A1 | 12/2002 | Park | |
| 2003/0015781 A1 * | 1/2003 | Farrar | 257/686 |
| 2003/0022462 A1 | 1/2003 | Farnworth et al. | |
| 2003/0038353 A1 * | 2/2003 | Derderian | 257/685 |
| 2003/0170921 A1 | 9/2003 | Akram | |
| 2004/0200885 A1 * | 10/2004 | Derderian | 228/180.5 |

FOREIGN PATENT DOCUMENTS

| | | | |
|---|---|---|---|
| JP | 357176738 A | 10/1982 |
| JP | 358157146 A | 9/1983 |
| JP | 59108341 A | 6/1984 |
| JP | 01238148 A | 9/1989 |
| JP | 404037137 A | 2/1992 |
| JP | 404062866 A | 2/1992 |
| JP | 11214432 A | 1/1998 |
| JP | 10189653 A | 7/1998 |
| JP | 411040608 A | 2/1999 |
| JP | 2000077458 A | 3/2000 |
| JP | 2000299330 A | 10/2000 |

OTHER PUBLICATIONS

U.S. Appl. No. 09/590,621, filed Jun. 8, 2000, entitled "Stereolithographic Method and Apparatus for Fabricating Stabilizers for Flip Chip Type Semiconductor Devices and Resulting Structures", inventor Akram et al.

"Glossary," FlipChip International, <<http://www.flipchip.com/serices/glossary/>> 2005, 5 pages.

"EIA/JEDEC Standard, Wire Bond Shear Test Method," EIA/JESD22-B116, Electronic Industries Alliance, Jul. 1998, pp. 1-10.

Minges et al., "Electronic Materials Handbook, vol. 1, Packaging," ASM International, Materials Park, OH, 1989, 3 pages.

Van Zant, Peter, "Microchip Fabrication, A Practical Guide to Semicondictor Processing," $2^{nd}$ Ed. McGraw-Hill, Inc., 1990, p. 502.

Lau, John H., "Chip on board Technologies for Multichip Modules," Van Nostrand Reinhold, 1994, 3 pages.

Tummala et al., "Microelectronics Packaging Handbook," Van Nostrand Reinhold, 1989, pp. 432-434.

The American Heritage® Dictionary of the English Language: Fourth Edition. 2000. Bartleby.com. 11-2-7 <http://www.bartleby.com/61/95/B0009500.htm>.

* cited by examiner

METHODS FOR ASSEMBLING SEMICONDUCTOR DEVICES IN STACKED ARRANGEMENTS BY POSITIONING SPACERS THEREBETWEEN

CROSS-REFERENCE TO RELATED APPLICATION

This application is a divisional of application Ser. No. 09/939,258, filed Aug. 24, 2001, now abandoned.

BACKGROUND OF THE INVENTION

1. Field of the Invention

The present invention relates to semiconductor device assemblies, or so-called "multi-chip modules," in which two or more semiconductor devices are stacked relative to one another. More specifically, the present invention relates to semiconductor device assemblies in which the distances between adjacent stacked semiconductor devices are determined, at least in part, by the heights of structures protruding from bond pads on an active surface of the lower of the adjacent stacked semiconductor devices.

2. Background of Related Art

In order to conserve the amount of surface area, or "real estate," consumed on a carrier substrate, such as a circuit board, by semiconductor devices connected thereto, various types of increased density packages have been developed. Among these semiconductor device packages are the so-called multi-chip module (MCM), which includes assemblies of semiconductor devices that are stacked one on top of another. The amount of surface area on a carrier substrate that may be saved by stacking semiconductor devices is readily apparent-a stack of semiconductor devices consumes roughly the same amount of real estate on a carrier substrate as a single, horizontally oriented semiconductor device or semiconductor device package.

Due to the disparity in processes that are used to form different types of semiconductor devices (e.g., the number and order of various process steps), it has proven very difficult to actually incorporate different types of functionality into a single semiconductor device. Even in cases where semiconductor devices that carry out multiple functions can be fabricated, multi-chip modules that include semiconductor devices with differing functions (e.g., memory, processing capabilities, etc.) are often much more desirable since the separate semiconductor devices may be fabricated and assembled with one another much more quickly and cost effectively (e.g., lower production costs due to higher volumes and lower failure rates).

Multi-chip modules may also contain a number of semiconductor devices that perform the same function, effectively combining the functionality of all of the semiconductor devices thereof into a single package.

An example of a conventional, stacked multi-chip module includes a carrier substrate, a first, larger semiconductor device secured to the carrier substrate and a second, smaller semiconductor device positioned over and secured to the first semiconductor device. The second semiconductor device does not overlie bond pads of the first semiconductor device and, thus, the second semiconductor device does not cover bond wires that electrically connect bond pads of the first semiconductor device to corresponding contacts or terminals of the carrier substrate. Such a multi-chip module is disclosed and illustrated in U.S. Pat. No. 6,212,767, issued to Tandy on Apr. 10, 2001 (hereinafter "the '767 Patent"). As the sizes of the semiconductor devices of such a multi-chip module continue to decrease as they are positioned increasingly higher on the stack, the obtainable heights of such multi-chip modules become severely limited.

Another example of a conventional multi-chip module is described in U.S. Pat. No. 5,323,060, issued to Fogal et al. on Jun. 21, 1994 (hereinafter "the '060 Patent"). The multi-chip module of the '060 Patent includes a carrier substrate with semiconductor devices disposed thereon in a stacked arrangement. The individual semiconductor devices of each multi-chip module may be the same size or different sizes, with upper semiconductor devices being either smaller or larger than underlying semiconductor devices. Adjacent semiconductor devices of each of the multi-chip modules disclosed in the '060 Patent are secured to one another with an adhesive layer. The thickness of each adhesive layer exceeds the loop heights of bond wires protruding from a semiconductor device upon which that adhesive layer is to be positioned. Accordingly, the presence of each adhesive layer prevents the back side of an overlying, upper semiconductor device from contacting bond wires that protrude from an immediately underlying, lower semiconductor device of the multi-chip module. The adhesive layers of the multi-chip modules disclosed in the '060 Patent do not encapsulate or otherwise cover any portion of the bond wires that protrude from any of the lower semiconductor devices. The multi-chip modules of the '060 Patent may be undesirably thick due to the large vertical distance between each adjacent pair of semiconductor devices that ensures that the back side of each upper semiconductor device is electrically isolated from the bond wires protruding over the active surface of the next, lower semiconductor device, which may result in wasted adhesive and excessive stack height.

A similar but more compact multi-chip module is disclosed in U.S. Patent Re. 36,613, issued to Ball on Mar. 14, 2000 (hereinafter "the '613 Patent"). The multi-chip module of the '613 Patent includes many of the same features as those disclosed in the '060 Patent, including adhesive layers that space vertically adjacent semiconductor devices apart a greater distance than the loop heights of bond wires protruding from the lower of the adjacent dice. The use of thinner bond wires with low loop profile wire bonding techniques permits adjacent semiconductor devices of the multi-chip module disclosed in the '060 Patent to be positioned more closely to one another than adjacent semiconductor devices of the multi-chip modules disclosed in the '060 Patent. Nonetheless, additional space remains between the tops of the bond wires protruding from one semiconductor device and the back side of the next higher semiconductor device of such a stacked multi-chip module.

Preformed silicon spacers are typically used to separate stacked semiconductor devices a sufficient distance from one another so that the back side of an upper semiconductor device will not contact underlying bond wires or other discrete conductive elements protruding above an active surface of a next lower semiconductor device. The use of silicon, polymeric films, or other preformed spacers is somewhat undesirable from the standpoint that each time a preformed spacer is used, additional alignment and assembly steps are required. For example, a preformed spacer must be positioned on an active surface of a semiconductor device in such a manner that the bond pads thereof or discrete conductive elements extending thereover are exposed beyond an outer periphery of the spacer. Further, when silicon spacers are used, adhesive material must be applied to either the spacer or the semiconductor devices the spacer is to be positioned between. As is well understood by those in the art of semiconductor device fabrication, additional alignment and assembly steps may decrease product yields and consequently increase production costs.

The vertical distance that adjacent semiconductor devices of a stacked type multi-chip module are spaced apart from one another may be reduced by arranging the semiconductor devices such that upper semiconductor devices are not positioned over bond pads of immediately underlying semiconductor devices or the bond wires or other discrete conductive elements protruding from these bond pads. Thus, adjacent semiconductor devices may be vertically spaced apart from one another a distance that is about the same as or less than the loop heights of the bond wires that protrude above the active surface of the lower semiconductor device. U.S. Pat. No. 6,051,886, issued to Fogal et al. on Apr. 18, 2000 (hereinafter "the '886 Patent") discloses such a multi-chip module. According to the '886 Patent, wire bonding is not conducted until all of the semiconductor devices of such a multi-chip module have been assembled with one another and with the underlying carrier substrate. The semiconductor devices of the multi-chip modules disclosed in the '886 Patent must have bond pads that are arranged on opposite peripheral edges. Semiconductor devices with bond pads positioned adjacent the entire peripheries thereof could not be used in the multi-chip modules of the '886 Patent. This is a particularly undesirable limitation due to the ever-increasing feature density of state-of-the-art semiconductor devices, which is often accompanied by a consequent need for an ever-increasing number of bond pads on semiconductor devices, as well as arrangement of bond pads over greater portions of the active surfaces of semiconductor devices.

In view of the foregoing, it appears that stacked assemblies in which an upper semiconductor device could be stacked over bond pads of an adjacent, lower semiconductor device to provide flexibility in bond pad number and placement would be useful, as would methods for forming such stacked assemblies. It also appears that methods and structures that reduce the number of different steps required in forming assemblies of stacked semiconductor devices would also be useful.

SUMMARY OF THE INVENTION

The present invention includes an assembly of stacked semiconductor devices in which a first semiconductor device may be secured to or otherwise associated with a substrate, such as a circuit board, an interposer, another semiconductor device, or a lead frame. Bond pads of the first semiconductor device may be electrically connected to corresponding contact areas of the substrate by way of discrete conductive elements or otherwise, as known in the art. A second semiconductor device of the assembly is positioned over and secured to the first semiconductor device and may overlie at least some discrete conductive elements protruding above the active surface of the first semiconductor device.

The back side of the second semiconductor device may be spaced apart from the active surface of the first semiconductor device, bond pads thereof, and any underlying discrete conductive elements by way of spacers that protrude from noncircuit, or "dummy," bond pads of the first semiconductor device. Alternatively, the spacers may protrude from and communicate with bond pads that communicate with a ground or reference voltage plane for the first semiconductor device. The distance between the first semiconductor device and the second semiconductor device is determined, at least in part, by the heights the spacers protrude over the active surface of the first semiconductor device.

Spacers that comprise either substantially linear or nonlinear elements of substantially uniform height may be formed on so-called "dummy" or grounded bond pads, which are also referred to herein as noncircuit bond pads, of the first semiconductor device by wire bond formation techniques. Nonlinear spacers may be shaped in such a manner as to impart them with some resilient compressibility upon receiving a force in the directions of the lengths thereof. The thicknesses (e.g., diameters) of the spacers may impart them with sufficient strength to collectively withstand the weight of a second semiconductor device resting thereon, as well as the force that may be applied thereto as the second semiconductor device is placed thereon. Alternatively, or in addition, the spacers may be coated with one or more materials that enhance their strengths.

While it is preferred that the discrete conductive elements that extend between the first and second semiconductor devices be spaced apart from the back side of the second semiconductor device, other means for electrically isolating the discrete conductive elements from the back side of an immediately overlying, second semiconductor device are also within the scope of the present invention. By way of example only, the discrete conductive elements may be electrically isolated from the back side of the second semiconductor device by way of a dielectric coating on at least contacting portions of one or both of the discrete conductive elements and the back side.

The second semiconductor device, which may be larger, smaller, or the same size as the underlying, first semiconductor device, is secured over the first semiconductor device by way of an adhesive material, which may comprise a dielectric material, disposed between the first and second semiconductor devices.

In one exemplary embodiment of an assembly including stacked semiconductor devices, the adhesive material may fill the entire gap between the first and second semiconductor devices, substantially encapsulating the portion of each discrete conductive element located therebetween. The adhesive material may have a low enough viscosity (high liquidity), that air or other gases located between the first and second semiconductor devices is readily displaced, reducing the tendency of voids to form around discrete conductive elements or between the first and second semiconductor devices.

When a low viscosity material, such as a conventional underfill material, is used to space the first and second semiconductor devices apart from one another, the second semiconductor device is positioned over the first semiconductor device, resting on and supported collectively by the spacers protruding from the active surface of the first semiconductor device. The second semiconductor device may be at least temporarily secured to the first semiconductor device by way of a small quantity of adhesive material, such as an adhesive polymer, solder flux, or the like, which may, for example, be placed on a surface of the first semiconductor device, the second semiconductor device, one or more discrete conductive elements, and/or one or more spacers prior to positioning the second semiconductor device over the first semiconductor device. The low viscosity adhesive material may then be introduced between the first and second semiconductor devices.

The wetting properties of a low viscosity adhesive material may facilitate spreading thereof over the active surface of the first semiconductor device and the back side of the second semiconductor device, as well as capillary action or "wicking" thereof through the spaces between the first and second semiconductor devices and around the portions of discrete conductive elements located between the first and second semiconductor devices. Spreading of the adhesive material may be aided by application of heat thereto or by mechanical vibration of the assembly. When a fixed quantity of adhesive material that is smaller than the volume between the first and second semiconductor devices is used, the surface tension of the adhesive material may cause the distance between the first and second semiconductor devices to decrease as the adhesive material spreads therebetween, thereby decreasing the overall height of the assembly. If the adhesive material is used to decrease the distance between the first and second semiconductor devices in this manner, it is preferred that the spacers be configured to compress somewhat and that a sufficient amount of adhesive material be used to prevent delicate, raised discrete conductive elements, such as bond wires, from being bent, distorted, or collapsed onto one another.

An adhesive material that has a relatively higher viscosity may be used in another exemplary embodiment of an assembly including stacked semiconductor devices. Due to its high viscosity, such an adhesive material may be applied over a portion of the active surface of the first semiconductor device prior to positioning the second semiconductor device thereover. Alternatively, the second semiconductor device may be positioned over the first semiconductor device, then a high viscosity adhesive material introduced therebetween.

When a high viscosity adhesive material is used, a controlled amount of force or loading may be applied to one or both of the active surface of the second semiconductor device or the bottom of the first semiconductor device or a substrate, if any, to which the first semiconductor device is secured in such a manner that the first semiconductor device and second semiconductor device are biased toward one another. In this manner, the distance between the first and second semiconductor devices may be controlled. Force or loading may also be applied to the active surface of the second semiconductor device to facilitate spreading of a high viscosity adhesive material between the first and second semiconductor devices. If such force or loading is used, it is preferred that the force or loading not be sufficient to undesirably deformably stress (e.g., bend, kink, distort, or collapse) the spacers that protrude from the active surface of the first semiconductor device or the first semiconductor device itself.

Once the adhesive material cures, it may provide some additional physical support to the second semiconductor device. The adhesive material may also serve as a dielectric coating for the discrete conductive elements or the back side of the second semiconductor device. Bond pads of the second semiconductor device may also be electrically connected to one or both of corresponding contact areas of the substrate and corresponding bond pads of the first semiconductor device.

Of course, assemblies incorporating teachings of the present invention may include more than two semiconductor devices in a stacked arrangement.

Once the semiconductor devices of such an assembly have been secured to one another and electrically connected with a substrate or with one another, the assembly may be packaged, as known in the art.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention.

DETAILED DESCRIPTION OF THE INVENTION

Figure 1:
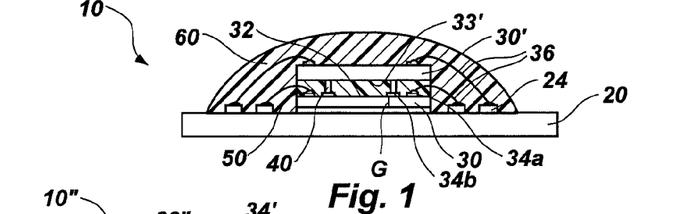
FIG. 1 is a cross-sectional representation of a first semiconductor device assembly incorporating teachings of the present invention, in which semiconductor devices are positioned in a stacked arrangement and at least one of the semiconductor devices is electrically connected to a circuit board.

With reference to FIG. 1, an exemplary embodiment of semiconductor device assembly 10 is illustrated. As depicted, semiconductor device assembly 10 includes a first semiconductor device 30 and a second semiconductor device 30' positioned over and spaced apart from first semiconductor device 30 by way of spacers 40.

Semiconductor device assembly 10 may also include a substrate 20, such as the depicted circuit board, an interposer, another semiconductor device, leads, or other suitable, known substrates.

First semiconductor device 30 includes first and second sets of bond pads 34a, 34b, respectively, on an active surface 32 thereof. Bond pads 34a communicate with circuitry of first semiconductor device 30 and, therefore, may also be referred to as "circuit bond pads." Accordingly, and as depicted, bond pads 34a are configured to be secured to discrete conductive elements 36, such as bond wires, tape-automated bond (TAB) elements comprising conductive traces carried on a flexible dielectric film, thermocompression bonded leads, or the like. When included in semiconductor device assembly 10, discrete conductive elements 36 electrically connect and, thus, establish electrical communication between bond pads 34a and corresponding contact areas 24 of a substrate 20 of semiconductor device assembly 10.

Bond pads 34b, which are also referred to herein as "noncircuit bond pads," are either bond pads that do not communicate with internal circuitry of first semiconductor device 30, or bond pads that communicate with a ground plane of first semiconductor device 30. Communication of noncircuit bond pads 34b with the ground or reference voltage plane of semiconductor device 30 is schematically represented by broken line G.

Spacers 40, which may comprise wire or other conductive elements, are secured to noncircuit bond pads 34b of first semiconductor device 30. Structural support may be imparted to each spacer 40 by use of thicker conductive elements, stronger materials, coatings that strengthen the conductive elements thereof, or as otherwise known in the art.

The height of each spacer 40 separates a back side 33' of second semiconductor device 30' a sufficient distance from active surface 32 of the underlying first semiconductor device 30 to prevent any discrete conductive elements 36 protruding above active surface 32 from electrically shorting against back side 33'. Thus, the heights of spacers 40 may prevent back side 33' of second semiconductor device 30' from contacting discrete conductive elements 36. Alternatively, if at least portions of one or both of discrete conductive elements 36 that contact back side 33' and portions of back side 33' that contact discrete conductive elements 36 are coated with an electrically insulative material (e.g., dielectric polymer, nonconductive oxide, such as a metal oxide, silicon oxide, or glass, etc.), the heights of spacers 40 may prevent discrete conductive elements 36 from being undesirably distorted or from collapsing onto one another when second semiconductor device 30' is placed over first semiconductor device 30.

Although spacers 40 are depicted in FIG. 1 as comprising substantially linear members that protrude from noncircuit bond pads 34b in a direction that is substantially perpendicular to the plane in which active surface 32 is located, spacers of other configurations are also within the scope of the present invention. By way of example only, the structures disclosed in U.S. Pat. Nos. 5,476,211; 5,832,601; 5,852,871; 5,864,946; and 5,884,398, each of which has been assigned to Form Factor, Inc. of Livermore, Calif. (hereinafter collectively referred to as "the Form Factor patents"), the disclosures of each of which are hereby incorporated in their entireties by this reference, may also be employed as spacers 40. FIGS. 10A-10D depict exemplary, resiliently compressible spacers 40a-40d, respectively, that may be used in the present invention.

A quantity of adhesive material 50 may be located between first semiconductor device 30 and second semiconductor device 30'. Adhesive material 50, which is preferably electrically nonconductive, or dielectric, may adhere to at least portions of active surface 32 of first semiconductor device 30, as well as to all or part of second semiconductor device 30' to secure first semiconductor device 30 and second semiconductor device 30' to one another. Exemplary adhesive materials that are useful in semiconductor device assembly 10 include low viscosity materials, such as thermoset resins, two-stage epoxies, or the like, as well as higher viscosity materials including, but not limited to, epoxies, silicones, silicone-carbon resins, polyimides, polyurethanes, and parylenes.

As depicted in FIG. 1, semiconductor device assembly 10 may also include a protective encapsulant 60. As shown, protective encapsulant 60 comprises a so-called "glob-top" Protective encapsulant 60 may cover and, thus, protect at least portions of one or more of second semiconductor device 30', first semiconductor device 30, discrete conductive elements 36, and portions of substrate 20 located adjacent to first semiconductor device 30. Alternatively, protective encapsulant 60 may comprise a molded structure, such as is formed by transfer or pot molding processes.

Figure 1A:
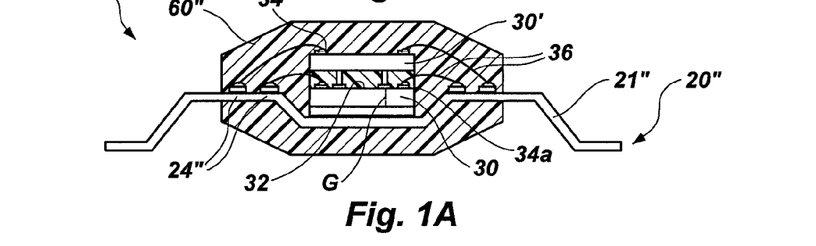
FIG. 1A is a cross-sectional representation of a second semiconductor device assembly according to the present invention, wherein semiconductor devices are stacked and at least one of the semiconductor devices is electrically connected to leads.

FIG. 1A depicts another embodiment of semiconductor device assembly 10" in which first and second semiconductor devices 30 and 30' are in stacked arrangement. Semiconductor device assembly 10" also includes a substrate 20" in the form of leads 21". Bond pads 34a of first semiconductor device 30 and bond pads 34' of second semiconductor device 30' are electrically connected to corresponding contact areas 24" of the leads of substrate 20" by way of discrete conductive elements 36. As an alternative, leads 21" may comprise leads-over-chip (LOC) type leads that extend partially over an active surface 32 of first semiconductor device 30. Such leads 21" may be electrically connected to corresponding bond pads 34a by way of discrete conductive elements 36. Alternatively, LOC type leads 21" may extend over corresponding bond pads 34a and be secured thereto by way of thermocompression bonds, direct-attach conductive structures that may, for example, be formed from solder, z-axis conductive elastomer, conductive epoxy, or conductor-filled epoxy, or otherwise, as known in the art.

In addition, and as depicted, semiconductor device assembly 10" may include a protective encapsulant 60". One or more of first semiconductor device 30, second semiconductor device 30', and discrete conductive elements 36 may be packaged by protective encapsulant 60". Portions of substrate 20" that are located adjacent to first and second semiconductor devices 30, 30' may also be enveloped by protective encapsulant 60". As shown, protective encapsulant 60" comprises a molded structure (e.g., a transfer molded or pot molded structure), although other types of protective encapsulants (e.g., glob-top encapsulants), or packages, are also within the scope of the present invention.

Turning now to FIGS. 2-9, exemplary embodiments of forming semiconductor device assemblies are depicted.

Figure 2:
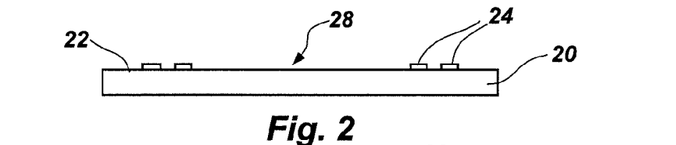
FIG. 2 is a side view of an exemplary substrate.

As shown in FIG. 2, a substrate 20 is provided. Although substrate 20 is depicted as a circuit board, which includes one or more external connective elements (not shown) in the form of pins, solder balls, plug-in members, or the like, other types of substrates and their accompanying external connective elements are also within the scope of the present invention, including, without limitation, interposers, other semiconductor devices, and leads. The depicted substrate 20 includes contact areas 24, in the form of terminals, which are positioned on an upper surface 22 thereof adjacent a die-attach location 28 of upper surface 22.

Figure 3:
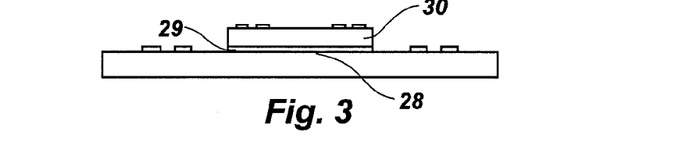
FIG. 3 is a side view of a first semiconductor device disposed on the substrate of FIG. 2.

In FIG. 3, a first semiconductor device 30 is positioned over die-attach location 28 and secured thereto with an adhesive element 29, such as an adhesive material (e.g., a conventional die attach material), an adhesive coated film (e.g., a polyimide film), or the like.

Figure 4:
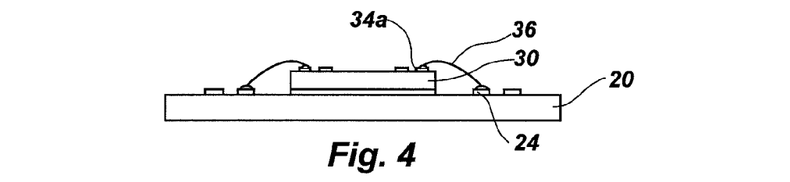
FIG. 4 is a side view depicting electrical connection of the first semiconductor device of FIG. 3 to the substrate.

As shown in FIG. 4, discrete conductive elements 36 may be formed or placed between and secured to bond pads 34a of first semiconductor device 30 and their corresponding contact areas 24 of substrate 20. Each discrete conductive element 36 electrically connects and, thus, establishes electrical communication between a bond pad 34a and its corresponding contact area 24. By way of example only, discrete conductive elements 36 may comprise bond wires that are formed between bond pads 34a and contact areas 24 with wire bonding equipment. As another example, each discrete conductive element 36 may comprise a TAB element or a lead that is placed between and in contact with a bond pad 34a and its corresponding contact area 24 and secured thereto by thermocompression bonding processes.

Figure 5:
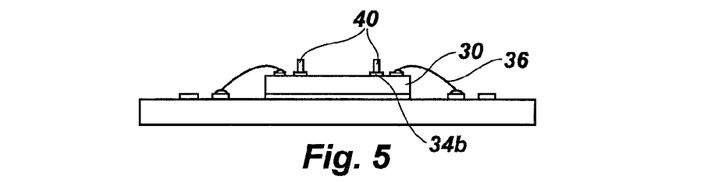
FIG. 5 is a side view depicting formation of spacers on noncircuit or grounded bond pads of the first semiconductor device of FIG. 3.

FIG. 5 illustrates the placement or formation of spacers 40 on noncircuit bond pads 34b of first semiconductor device 30. Spacers 40 may be secured to or formed on noncircuit bond pads 34b before, after, or during the formation or placement and securing of discrete conductive elements 36. As an example, and not to limit the scope of the present invention, spacers 40 may be fabricated on noncircuit bond pads 34b by use of wire bonding equipment and accompanying wire bonding techniques, such as conventional wire bonding processes or those disclosed in the Form Factor patents. Alternative types of spacers 40, such as balls, bumps, pillars, or columns, may be formed and/or secured to noncircuit bond pads 34b by appropriate techniques known in the art. For example, a solder mask and solder reflow techniques may be used to form and secure solder balls or bumps to noncircuit bond pads 34b. Other types of spacers 40 may be positioned on a noncircuit bond pad 34b and secured thereto by use of a conductive adhesive or by heating or otherwise reflowing adjacent portions of one or both of spacer 40 and noncircuit bond pad 34b. Of course, the manner in which a spacer 40 is formed and secured to a noncircuit bond pad 34b depends, at least in part, upon the type of spacer 40 being used.

Figure 6:
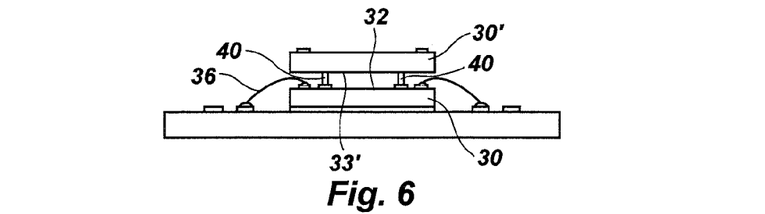
FIG. 6 is a side view that illustrates positioning of a second semiconductor device over the first semiconductor device and placement of the second semiconductor device on the spacers of FIG. 5.

Once spacers 40 have been formed, a second semiconductor device 30' may be positioned over first semiconductor device 30, as depicted in FIG. 6. Back side 33' of second semiconductor device 30' rests upon uppermost portions of spacers 40. As depicted, the heights of spacers 40 may prevent discrete conductive elements 36 from contacting back side 33' of second semiconductor device 30', electrically isolating discrete conductive elements 36 and back side 33' from one another. If spacers 40 are connected to a ground plane, back side 33' of second semiconductor device 30' is thus also grounded by contact with spacers 40.

Prior to introduction of an adhesive material between at least portions of active surface 32 of first semiconductor device 30 and back side 33' of second semiconductor device 30', a position of second semiconductor device 30' may be maintained by way of adhesive material (not shown), such as a pressure-sensitive adhesive material, solder flux, or the like, disposed on either back side 33' of second semiconductor device 30', on an active surface 32 of first semiconductor device 30, and/or on uppermost portions of spacers 40.

Figure 7:
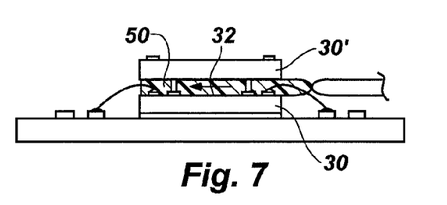
FIG. 7 is a cross-sectional representation of the assembly of FIG. 6, showing the introduction of an adhesive material between the first and second semiconductor devices.

As depicted in FIG. 7, when second semiconductor device 30' has been properly positioned over first semiconductor device 30, an at least partially unconsolidated adhesive material 50 may be introduced between first and second semiconductor devices 30 and 30'. Adhesive material 50 preferably has a low enough viscosity and high enough surface tension to facilitate introduction thereof by capillary action, or wicking, between first and second semiconductor devices 30 and 30'. The viscosity of adhesive material 50 may also be low enough to prevent bond wire sweep. Nonetheless, the viscosity and/or surface tension of adhesive material 50 may be sufficient to prevent flowing thereof off of active surface 32 of first semiconductor device 30. By way of example only, adhesive material 50 may comprise an epoxy, a silicone, a silicone-carbon resin, a polyimide, a polyurethane, or a parylene.

Figure 6A:
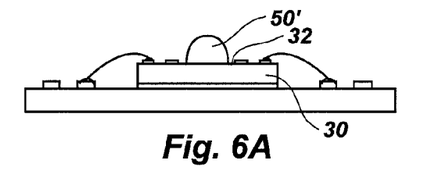
FIG. 6A is a side view that illustrates the alternate disposal of a quantity of adhesive material onto the semiconductor device of FIG. 5.
Figure 7A:
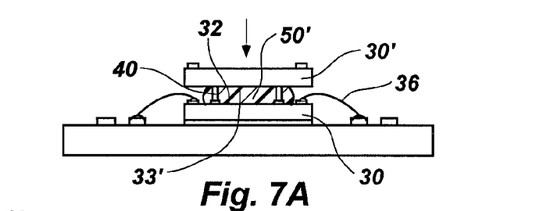
FIG. 7A is a side view depicting positioning of a second semiconductor device over the first semiconductor device and contacting a back side of the second semiconductor device with the adhesive material of FIG. 6A.

FIGS. 6A and 7A illustrate an alternative to the processes discussed herein with reference to FIGS. 6 and 7.

In FIG. 6A, a higher viscosity adhesive material 50' is disposed on active surface 32 of first semiconductor device 30. Adhesive material 50' has a higher viscosity and/or surface tension than adhesive material 50, which allows adhesive material 50' to form a raised structure prior to being cured to an at least semisolid state without flowing.

Next, as depicted in FIG. 7A, a second semiconductor device 30' is positioned over first semiconductor device 30, as well as over adhesive material 50' on active surface 32 thereof. As one or both of first semiconductor device 30 and second semiconductor device 30' are moved toward one another (e.g., by die attach equipment), back side 33' of second semiconductor device 30' contacts adhesive material 50', causing adhesive material 50' to spread somewhat over back side 33', as well as active surface 32 of first semiconductor device 30. First and second semiconductor devices 30 and 30' are moved toward one another as indicated by an arrow at least until back side 33' of second semiconductor device 30' contacts upper portions of spacers 40. If spacers 40 are somewhat compressible, first and second semiconductor devices 30 and 30' may be moved even more closely toward each other. Adhesive material 50' may spread to a lateral location beyond which discrete conductive elements 36 are exposed, or may partially or fully encapsulate portions of discrete conductive elements 36 that are located between first semiconductor device 30 and second semiconductor device 30'.

Adhesive material 50, 50' may then be fully or partially hardened to an at least semisolid state, as appropriate for the type of material employed, securing first and second semiconductor devices 30 and 30' to one another. By way of example, thermoplastic adhesive materials 50, 50' may be cooled or permitted to cool. Other types of adhesive materials 50, 50' may be cured by processes such as heat curing, snap curing, UV curing, catalytic curing, or appropriate combinations thereof. As an example of the use of a combination of curing processes, some known adhesive materials 50, 50', such as some of the die attach and thermal adhesives marketed as QUANTUM® adhesives by Dexter Corporation of Industry, Calif., may be cured by both UV curing and heat or snap curing processes. Exposed, edge portions of these adhesive materials 50, 50' may be UV-cured to form an external fillet which contains internal, unconsolidated adhesive material 50, 50', which may then be cured by heat or snap curing processes.

If spacers 40 comprise somewhat compressible structures, such as those depicted in FIGS. 10A-10D and described in the Form Factor patents, an adhesive material 50, 50' that shrinks somewhat upon being cured may be employed.

Figure 11A:
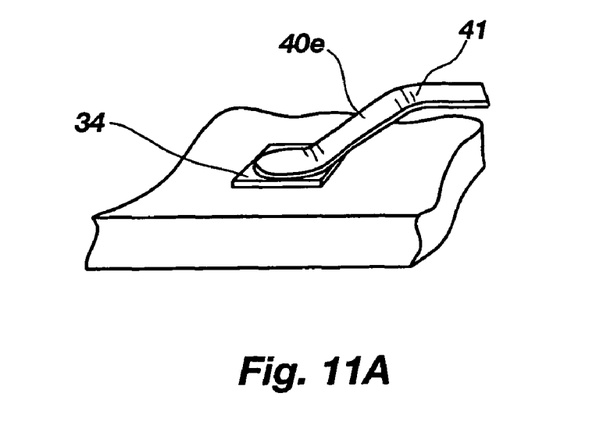
FIGS. 11A and 11B schematically depict other configurations of spacers that may be used in accordance with teachings of the present invention.
Figure 11B:
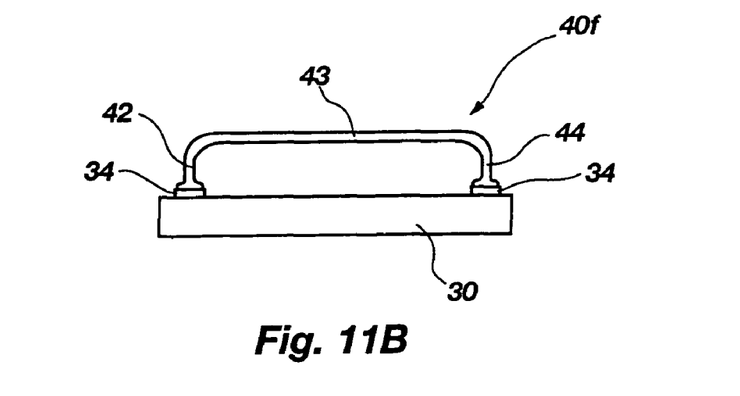

Alternative configurations of spacers 40e and 40f are shown in FIGS. 11A and 11B. Spacer 40e of FIG. 11A includes a ribbon wire 41 that is secured to a bond pad 34 by way of a wedge bond, while spacer 40f of FIG. 11B is a structure that includes opposite end portions 42 and 44 that are secured to different bond pads 34 of a semiconductor device 30 and a central portion 43 located between end portions 42 and 44 and extending over a portion of a semiconductor device 30.

Figure 8:
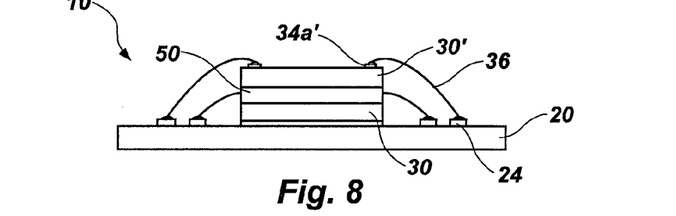
FIG. 8 is a side view that illustrates electrical connection of the second semiconductor device with the substrate.

Once adhesive material 50 has cured sufficiently to secure the relative positions of first semiconductor device 30 and second semiconductor device 30', discrete conductive elements 36 may be formed between bond pads 34a' of second semiconductor device 30' and corresponding contact areas 24 of substrate 20, as depicted in FIG. 8. Discrete conductive elements 36 may comprise bond wires, TAB elements, thermocompression bonded leads, or any other suitable, known type of discrete conductive element. Discrete conductive elements 36 are formed by suitable techniques which, of course, depend upon the particular type of discrete conductive element 36 used in semiconductor device assembly 10.

Figure 9:
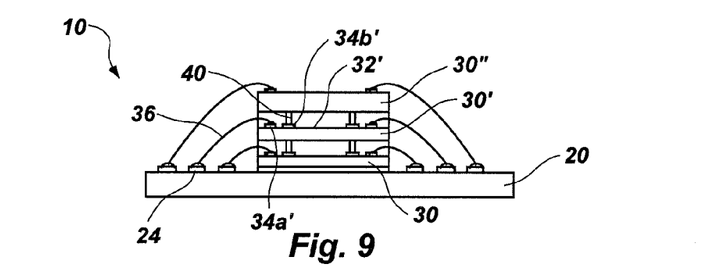
FIG. 9 is a side view which shows that additional semiconductor devices may be stacked over the first and second semiconductor devices and electrically connected to the substrate.
Figures 10A, 10B:
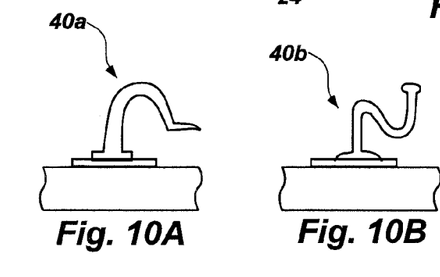
FIGS. 10A-10D schematically depict exemplary compressible spacers that may be used in accordance with teachings of the present invention.
Figure 10C:
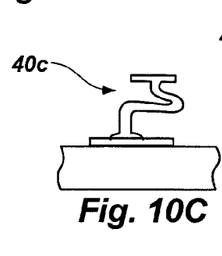
Figure 10D:
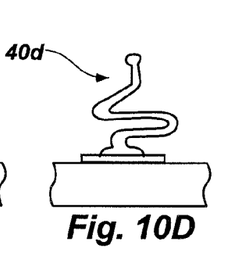

In the event that assembly of additional semiconductor devices 30" over semiconductor devices 30 and 30' is desired, as shown in FIG. 9, second semiconductor device 30' may include noncircuit bond pads 34b' on an active surface 32' thereof, upon which additional spacers 40 may be formed. These additional spacers 40 may be formed prior to, concurrently with, or subsequent to the formation of discrete conductive elements 36 between bond pads 34a' of second semiconductor device 30' and their corresponding contact areas 24 of substrate 20. The processes described herein with reference to FIGS. 6-8 may be repeated until semiconductor device assembly 10 includes a desired number of semiconductor devices.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for assembling semiconductor devices in stacked arrangement, comprising:
    securing a semiconductor device to a substrate, the semiconductor device including integrated circuitry, circuit bond pads in communication with the integrated circuitry, and noncircuit bond pads electrically isolated from the integrated circuitry;
    placing discrete conductive elements between the circuit bond pads of the semiconductor device and corresponding contact areas of the substrate, electrically connecting the semiconductor device to the substrate;
    securing discrete spacers at a plurality of laterally spaced-apart positions directly to at least some of the noncircuit bond pads;
    positioning another semiconductor device over the semiconductor device, after securing the discrete spacers directly to the at least some of the noncircuit bond pads, with the discrete spacers in contact with a back side of the another semiconductor device to space the another semiconductor device sufficiently above the semiconductor device to prevent contact of the back side of the another semiconductor device with portions of the discrete conductive elements positioned between the semiconductor device and the another semiconductor device;
    maintaining a position of the another semiconductor device over the semiconductor device with an adhesive material; and
    introducing another, at least partially unconsolidated adhesive material between the semiconductor device and the another semiconductor device, around the discrete spacers and around the portions of the discrete conductive elements positioned between the semiconductor device and the another semiconductor device by capillary action.

2. The method of claim 1, wherein securing a semiconductor device to a substrate comprises securing a semiconductor device to at least one of a circuit board, an interposer, another semiconductor device, and leads.

3. The method of claim 1, wherein placing discrete conductive elements between the circuit bond pads of the semiconductor device and corresponding contact areas of the substrate comprises placing bond wires between the circuit bond pads of the semiconductor device and corresponding contact areas of the substrate.

4. The method of claim 3, wherein placing comprises wire bonding.

5. The method of claim 1, wherein securing discrete spacers comprises securing spacers comprising a wire.

6. The method of claim 1, wherein securing discrete spacers comprises disposing the discrete spacers in communication with a ground plane of the semiconductor device.

7. The method of claim 1, further comprising:
    positioning at least one additional semiconductor device over the another semiconductor device.

8. The method of claim 1, further comprising:
    substantially encapsulating the semiconductor device, the discrete spacers, the another semiconductor device, portions of the discrete conductive elements extending beyond the another adhesive material, and portions of the substrate located laterally adjacent to the semiconductor device.

9. The method of claim 1, further comprising:
    placing at least one external conductive element in communication with at least one corresponding contact area of the substrate.

10. A method for assembling semiconductor devices in stacked arrangement, comprising:
    securing a plurality of discrete spacers each comprising a wire, directly to noncircuit bond pads on an active surface of a semiconductor device, the noncircuit bond pads and the plurality of discrete spacers being electrically isolated from integrated circuitry of the semiconductor device;
    disposing a high viscosity adhesive material on the active surface of the semiconductor device; positioning another semiconductor device in stacked relation to the semiconductor device, over the active surface of the semiconductor device and over adhesive material; and
    moving the another semiconductor device toward the semiconductor device to contact the high viscosity adhesive material and cause the high viscosity adhesive material to spread laterally between the semiconductor device and the another semiconductor device at least until the another semiconductor device contacts upper portions of the spacers.

11. The method of claim 10, wherein securing the plurality of discrete spacers comprises positioning preformed spacers on the active surface of the semiconductor device.

12. The method of claim 10, wherein securing the plurality of discrete spacers comprises forming the discrete spacers of the plurality on the active surface of the semiconductor device.

13. The method of claim 10, wherein securing the plurality of discrete spacers comprises securing ribbon wire directly to noncircuit bond pads on the active surface of the semiconductor device.

14. The method of claim 10, wherein securing the plurality of discrete spacers comprises placing the plurality of discrete spacers in communication with a ground plane of the semiconductor device.

15. The method of claim 10, further comprising:
    placing at least one additional semiconductor device in stacked relation relative to the semiconductor device and the another semiconductor device.

16. The method of claim 10, wherein securing comprises disposing the plurality of discrete spacers on at least one of the active surface of the semiconductor device and an active surface of the another semiconductor device.

17. The method of claim 10, further comprising:
    securing at least one of the semiconductor device and the another semiconductor device to a substrate.

18. The method of claim 17, wherein securing at least one of the semiconductor device and the another semiconductor device to the substrate comprises securing at least one of the semiconductor device and the another semiconductor device to one of a circuit board, an interposer, an additional semiconductor device, and leads.

19. The method of claim 17, further comprising:
electrically connecting bond pads of at least one of the semiconductor device and the another semiconductor device to corresponding contact areas of the substrate.

20. The method of claim 19, wherein electrically connecting comprises placing discrete conductive elements between the bond pads and the corresponding contact areas.

21. The method of claim 20, wherein placing comprises wire bonding.

22. The method of claim 19, wherein electrically connecting comprises electrically connecting bond pads of both the semiconductor device and the another semiconductor device to corresponding contact areas of the substrate.

23. The method of claim 19, further comprising:
substantially encapsulating the semiconductor device, the plurality of discrete spacers, the another semiconductor device, and portions of the substrate located laterally adjacent to the semiconductor device.

24. The method of claim 19, further comprising:
placing at least one external conductive element in communication with at least one corresponding contact area of the substrate.

25. The method of claim 10, further comprising continuing to move the another semiconductor device toward the semiconductor device after contact of the another semiconductor device with the upper portions of the plurality of discrete spacers to compress the plurality of discrete spacers and further laterally spread the high viscosity adhesive material.

26. The method of claim 10, further comprising causing the high viscosity adhesive material to shrink by curing, and compressing the plurality of discrete spacers.

27. The method of claim 5, further comprising causing the another adhesive material to shrink by curing, and compressing the discrete spacers.

* * * * *

UNITED STATES PATENT AND TRADEMARK OFFICE
CERTIFICATE OF CORRECTION

PATENT NO. : 8,101,459 B2
APPLICATION NO. : 10/834651
DATED : January 24, 2012
INVENTOR(S) : James M. Derderian It is certified that error appears in the above-identified patent and that said Letters Patent is hereby corrected as shown below:

In column 12, line 31, in Claim 10, delete "device," and insert -- device --, therefor.

Signed and Sealed this
Twenty-seventh Day of March, 2012

David J. Kappos
*Director of the United States Patent and Trademark Office*